United States Patent
Ueno et al.

(10) Patent No.: US 8,148,271 B2
(45) Date of Patent: Apr. 3, 2012

(54) SUBSTRATE PROCESSING APPARATUS, COOLANT GAS SUPPLY NOZZLE AND SEMICONDUCTOR DEVICE MANUFACTURING METHOD

(75) Inventors: Masaaki Ueno, Toyama (JP); Akira Hayashida, Toyama (JP); Masakazu Shimada, Toyama (JP); Takenori Oka, Kitakyushu (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 818 days.

(21) Appl. No.: 11/989,698

(22) PCT Filed: Jul. 19, 2006

(86) PCT No.: PCT/JP2006/314241
§ 371 (c)(1),
(2), (4) Date: Nov. 6, 2008

(87) PCT Pub. No.: WO2007/018016
PCT Pub. Date: Feb. 15, 2007

(65) Prior Publication Data
US 2009/0291566 A1    Nov. 26, 2009

(30) Foreign Application Priority Data

Aug. 5, 2005 (JP) ................................ 2005-227606

(51) Int. Cl.
*H01L 21/302* (2006.01)

(52) U.S. Cl. ........ 438/748; 438/704; 438/706; 438/749; 118/696; 118/715; 118/719; 118/730; 257/E21.283

(58) Field of Classification Search .................. None
See application file for complete search history.

(56) References Cited

U.S. PATENT DOCUMENTS 6,074,486 A * 6/2000 Yang et al. .................... 118/719

FOREIGN PATENT DOCUMENTS

| JP | 1-220434 | 9/1989 |
|---|---|---|
| JP | 11-67782 | 3/1999 |
| JP | 2000-311862 | 11/2000 |
| JP | 2001-176810 | 6/2001 |
| JP | 2003-17422 | 1/2003 |
| JP | 2004-95950 | 3/2004 |
| JP | 2004-304096 | 10/2004 |
| JP | 2005-197373 | 7/2005 |
| JP | 2005-317734 | 11/2005 |

OTHER PUBLICATIONS

Office Action dated Oct. 26, 2009 issued regarding Taiwan Patent Application No. 95128191 with English translation.

\* cited by examiner

*Primary Examiner* — N Drew Richards
*Assistant Examiner* — Kyoung Lee
(74) *Attorney, Agent, or Firm* — Kratz, Quintos & Hanson, LLP (57) ABSTRACT

A substrate processing apparatus comprises a processing chamber for storing a boat supporting multiple substrates and for processing the multiple substrates, a heater unit installed around the processing chamber for heating the substrates, and a coolant gas supply nozzle including a pipe section extending perpendicular to a main surface of the substrate supported in the boat stored in the processing chamber, and a spray hole formed on the pipe section for spraying coolant gas to at least two of the multiple substrates, wherein the coolant gas supply nozzle is formed so that the cross sectional area of the pipe section in the area where the spray hole is formed is larger than the total opening area of the spray hole.

20 Claims, 6 Drawing Sheets

SUBSTRATE PROCESSING APPARATUS, COOLANT GAS SUPPLY NOZZLE AND SEMICONDUCTOR DEVICE MANUFACTURING METHOD

TECHNICAL FIELD

The present invention relates to a substrate processing apparatus, and for example, relates to technology effectively utilized in heat treatment apparatus (furnaces) such as annealing apparatus, diffusion apparatus, oxidizer apparatus and CVD apparatus utilized in methods for manufacturing semiconductor integrated circuit devices (hereinafter called "IC").

BACKGROUND ART

Batch type vertical hot wall depressurizing CVD apparatus are widely used in IC manufacturing methods in film-forming processes for forming CVD films such as silicon nitride ($Si_3N_4$) or silicon oxide and poly-silicon on semiconductor wafers (hereinafter called "wafers") on which integrated circuits including semiconductor devices are fabricated.

A process tube is installed vertically inside this batch type vertical hot wall depressurizing CVD apparatus (hereinafter called "CVD apparatus"). The process tube is made from an inner tube that forms the processing chamber and an outer tube that encloses the inner tube.

A heater unit for heating the processing chamber is installed outside the process tube. A gas supply pipe for supplying film forming gas as the process gas into the processing chamber, and an exhaust pipe for vacuum-exhausting the processing chamber are each connected to a manifold that supports the process tube.

A standby chamber is formed below the process tube. A boat elevator for lowering and raising the boat via a seal cap is installed in this standby chamber. The seal cap is structured so as to open and close the opening in the lower end of the process tube by raising and lowering of the boat elevator. The boat is installed vertically on the seal cap. The boat is structured to maintain each of the multiple wafers horizontally while arrayed perpendicularly along the center.

The boat is then loaded into the processing chamber from the bottom opening of the process tube while holding the multiple wafers arrayed perpendicularly. The gas supply pipe supplies film-forming gas into the processing chamber in a state where the furnace is sealed by the seal cap and the heater unit heats the processing chamber. A CVD film is deposited on the wafer. (See for example, patent document 1)
Patent document 1: Japanese Patent Non-Examined Publication No. 2002-110556

Usually, in heat treatment apparatus such as CVD apparatus, the processing chamber is purged with nitrogen gas after heat treatment and the temperature is lowered to a specified temperature, and then the boat is unloading from the processing chamber.

Lowering the temperature is necessary because it prevents a phenomenon where if the boat is unloaded while still at processing temperature, a large temperature differential occurs between wafers and a large temperature differential occurs within the wafer surface which adversely affects the IC device characteristics.

In heat treatment apparatus of this type in the prior art, a gas supply pipe whose spray port is positioned lower than the boat is clamped to a manifold and this gas supply pipe supplies nitrogen gas into the processing chamber.

DISCLOSURE OF INVENTION

Problems to be Solved by Invention

However, the heat treatment apparatus of the prior art has the problem that the gas supply pipe whose spray port is positioned lower than the boat, supplies nitrogen gas into the processing chamber so that the temperature of the wafers does not lower uniformly.

In other words, the gas supply pipe is installed so that the spray port is positioned at one location below the boat in the processing chamber and therefore the nitrogen gas cannot make contact with the wafer group at a uniform flow. Restated, the nitrogen gas flow is not uniform so that cooling of the wafer group within that area and within the wafer surface is non-uniform and only those wafers or wafer surface exposed to nitrogen gas at a fast flow speed is cooled.

The present invention has an object of providing a substrate processing apparatus capable of improving the temperature lowering speed as well as preventing a temperature differential between the substrates and in the substrate surface.

Means to Solve the Problems

In order to resolve the aforementioned problems, the aspect of this invention is described as follows.
A substrate processing apparatus comprising:
a processing chamber for storing a boat supporting multiple substrates and for processing the multiple substrates,
a heater unit installed around the processing chamber for heating the substrates, and
a coolant gas supply nozzle including a pipe section extending perpendicular to a main surface of the substrate supported in the boat stored in the processing chamber, and a spray hole formed on the pipe section for spraying coolant gas to at least two of the multiple substrates, wherein the coolant gas supply nozzle is formed so that the cross sectional area of the pipe section in the area where the spray hole is formed is larger than the total opening area of the spray hole.

Effect of Invention

The invention according to the above aspect is capable of lowering the temperature of the processed substrates quickly and uniformly by spraying coolant gas from the coolant gas supply nozzle.

The above aspect of the invention is capable of preventing a coolant gas pressure differential from occurring during spray from the spray hole since the cross sectional area of the pipe section of the coolant gas supply nozzle in the area where the spray hole is formed, is set larger than the total opening area of the spray hole.

BEST MODE FOR CARRYING OUT THE INVENTION

An embodiment of the present invention is described next while referring to the drawings.

Figure 1:
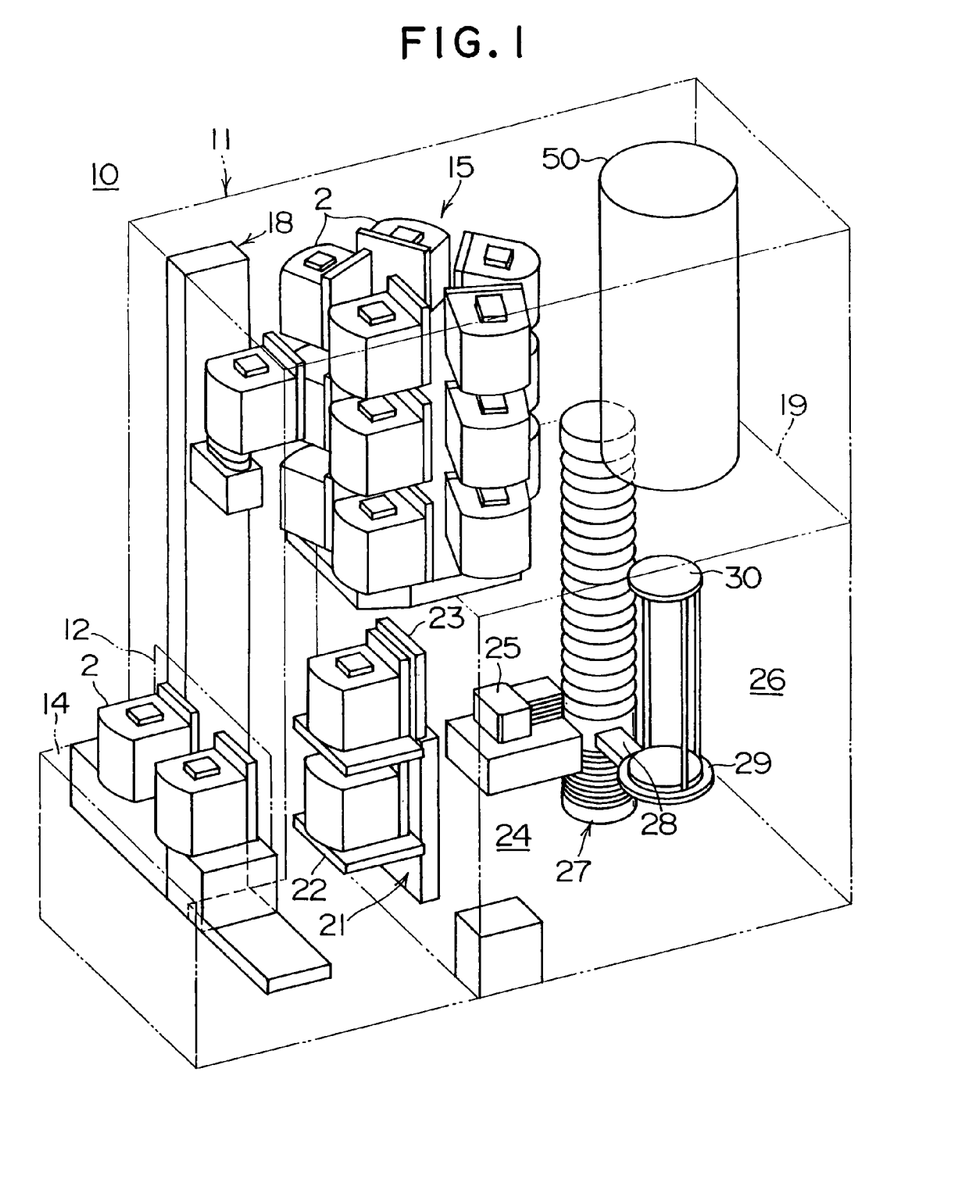
FIG. 1 is a partially abbreviated perspective view showing the annealing apparatus of an embodiment of the present invention.
Figure 2:
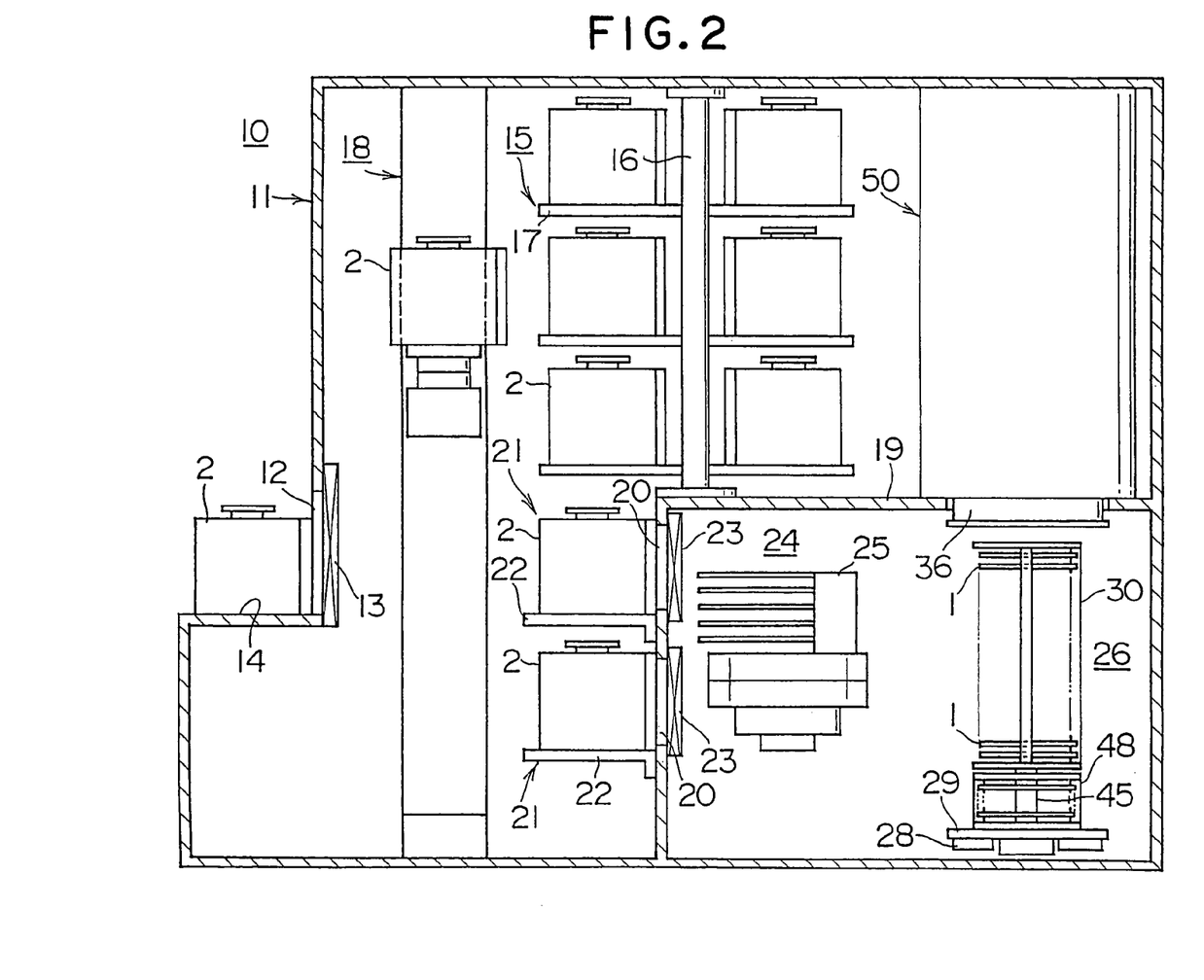
FIG. 2 is a side cross sectional view of the drawing in FIG. 1.
Figure 3:
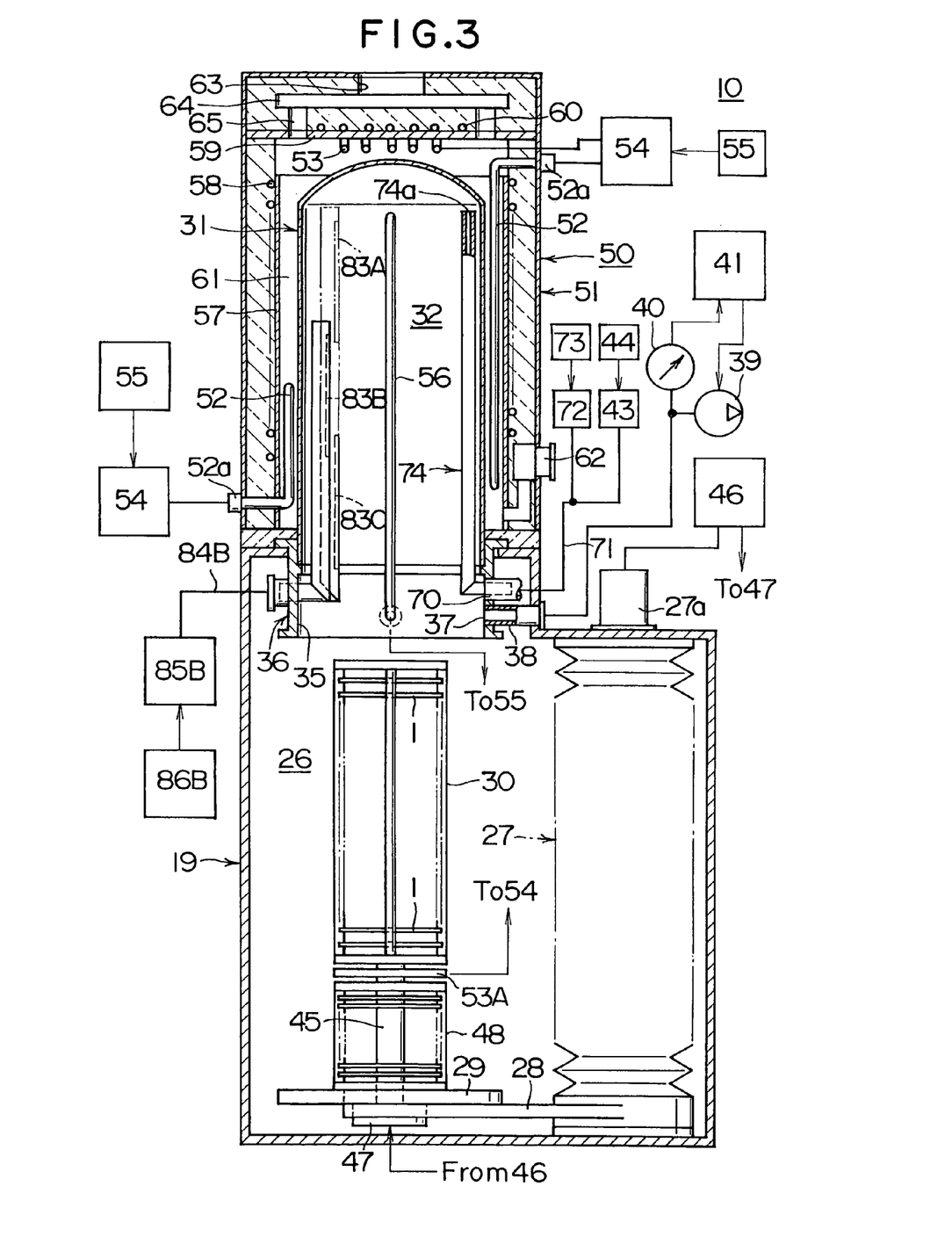
FIG. 3 is a rear cross sectional view of the drawing in FIG. 1.

The substrate processing apparatus of the present invention in this embodiment as shown in FIG. 1, FIG. 2, and FIG. 3 is an annealing apparatus (batch type vertical hot wall annealing apparatus) 10 for implementing the annealing process in the IC manufacturing method.

The annealing apparatus utilizes a FOUP (front opening unified pod. hereinafter called "pod") 2 that serves as the wafer carrier for transferring wafers 1.

The annealing apparatus 10 as shown in FIG. 1 through FIG. 3, includes a case 11 structured in rectangular parallelepiped box shape of steel plate or section steel. A pod carry-in/out port 12 is formed on the front wall of the case 11 to connect the inside and outside of the case 11. A front shutter 13 opens and closes the pod carry-in/out port 12.

A pod stage 14 is installed in front of the pod carry-in/out port 12. The pod stage 14 is designed to mount the pod 2 and align the pod 2 mounting position.

A process internal transfer device (not shown in the drawings) carries the pod 2 onto the pod stage 14 and also carries the pod 2 out from pod stage 14.

A rotating pod rack 15 is installed on the upper section at the approximate center section along the front and rear in the case 11. This rotating pod rack 15 is structured to store the multiple pods 2.

Namely, the rotating pod rack 15 contains a support pillar 16 erected perpendicularly and rotated intermittently within a horizontal plane, and multiple rack plates 17 supported by the support pillar 16 and radiating outward from it at the top, intermediate and bottom levels. The multiple rack plates 17 are structured to hold each of the multiple pods 2 in a mounted state.

A pod transfer device 18 is installed between the rotating pod rack 15 and the pod stage 14 in the case 11. The pod transfer device 18 is structured to transfer the pod 2 between the rotating pod rack 15 and the pod stage 14 and between the rotating pod rack 15 and a pod opener 21.

A sub-case 19 is constructed across the rear end at the lower section in the approximate center section along the front and rear in the case 11.

A pair of wafer carry-in/out ports 20 for carrying the wafer 1 into and out of the sub-case 19 are formed perpendicularly arrayed at two upper and lower stages on the front wall of the sub-case 19. A pair of pod openers 21, 21 are respectively installed on the upper and lower wafer carry-in/out ports 20, 20.

The pod opener 21 includes a mount stand 22 for mounting the pod 2, and a cap fitter/remover 23 for fitting and removing the cap on the pod 2. The cap fitter/remover 23 removes or fits the cap for the pod 2 mounted on the mount stand 22 to allow the pod opener 21 to open and close the wafer loading/unloading port of the pod 2.

The pod transfer device 18 carries the pod 2 into and out of the mount stand 22 of the pod opener 21.

A transfer chamber 24 is formed on the front side area in the sub-case 19, and a wafer transfer device 25 is installed in the transfer chamber 24. The wafer transfer device 25 is structured to charge the wafer 1 into a boat 30 and discharge the wafer 1 from the boat 30.

A standby chamber 26 is formed at the rear side area within the sub-case 19 to store the boat and keep it in standby.

A boat elevator 27 for raising and lowering the boat is installed in the standby chamber 26. The boat elevator 27 is made up of motor-driven feed screw shaft device or bellows, etc.

A seal cap 29 is installed horizontally on an arm 28 connected to the elevator stand of the boat elevator 27. The seal cap 29 is structured to perpendicularly support the boat 30.

The boat 30 contains multiple support members. These support members horizontally support each of the multiple (for example about 50 to 150 pieces) wafers 1 in a state where the center of the wafers is arrayed vertically.

As shown in FIG. 3, the annealing apparatus 10 contains a vertical process tube 31 arranged and supported vertically so that the center line of the tube is perpendicular.

The process tube 31 is formed in a tubular one-piece shape closed at the top end and open at the bottom end and using as one example, quartz ($SiO_2$) as a material allowing heat rays (infrared rays or far-infrared rays, etc.) from the heating lamp described later to penetrate through.

A processing chamber 32 where multiple wafers are carried in while maintained in a long array by the boat 30 is formed in the hollow center of the process tube 31. The inner diameter of the process tube 31 is set larger than the maximum outer diameter (for example, a diameter of 300 mm) of the wafers being handled.

A manifold 36 fabricated approximately in a tubular shape supports the bottom end of the process tube 31. The bottom end opening of the manifold 36 forms a furnace opening 35. The manifold 36 is installed to be freely detachable or mountable on the process tube 31 to allow replacing the process tube 31. The sub-case 19 supports the manifold 36 so that the process tube 31 is installed in a perpendicular state.

An exhaust port 37 is formed on the manifold 36 as shown in FIG. 3. The exhaust port 37 connects to one end of an exhaust pipe 38 for exhausting the process chamber 32. The other end of the exhaust pipe 38 connects via a pressure sensor 40 to an exhaust device 39 controlled by a pressure controller 41.

The pressure controller 41 is structured to perform feedback control of the exhaust device 39 based on measurement results from the pressure sensor 40.

The seal cap 29 makes contact with the bottom side of the manifold 36 from the lower side to seal the furnace opening 35. This seal cap 29 is formed in a disk shape approximately equal to the outer diameter of the manifold 36.

A rotating shaft 45 is inserted along the center line of the seal cap 29 and supported to allow rotation. The rotating shaft 45 is driven by a motor 47 that is controlled by a device controller 46.

The drive controller 46 also controls a motor 27*a* for the boat elevator 27.

The boat 30 is erected perpendicularly and supported at the upper end of the rotating shaft 45. A heat-insulating cap 48 is installed between the seal cap 29 and the boat 30. The bottom end of the boat 30 is supported by the rotating shaft 45 in a state where raised from the upper surface of the seal cap 29 so as to be separated by a proper distance from the position of the furnace opening 35. A heat-insulating cap 48 is structured to fill the space between the seal cap 29 and the bottom end of the boat 30.

A heater unit 50 is installed on the outer side of the process tube 31.

The heater unit 50 includes a heat-insulating tank 51 of small thermal capacity for covering the entire process tube 31. The heat-insulating tank 51 is supported vertically on the sub-case 19. Multiple halogen lamps (hereinafter called "heating lamps") 52 in an L shape as a heating means are installed concentrically at equidistant spaces along the periphery on inner side of the heat-insulating tank 51. The heating lamp group 52 is installed concentrically combined in multiple standards in different lengths and is structured to increase the heat emissions at the lower section and upper section of the process tube 31 where heat tends to easily dissipate away.

The terminals 52a on each heating lamp 52 are installed respectively on the upper section and lower section of the process tube 31. A drop in heat emissions by the terminals 52a is prevented. The heating lamp 52 is a filament of carbon or tungsten covered by a quartz pipe in an L-shape, and an atmosphere of inert gas or a vacuum is sealed inside the quartz pipe.

The heating lamp 52 radiates heat rays at a peak wavelength of approximately 1.0 microns to 2.0 microns as thermal energy. The heating lamp 52 is set to heat the wafer 1 by radiation with virtually no heating of the process tube 31.

Multiple L-shaped halogen lamps (hereinafter called "ceiling heating lamps") 53 are installed mutually parallel to each other with both edges aligned as shown in FIG. 3, in the center section on the lower side of the ceiling side of the heat-insulating tank 51. The ceiling heating lamp 53 group is structured to heat the wafer 1 group held in the boat 30 from above the process tube 31.

The ceiling heating lamp 53 is a filament of carbon or tungsten covered by an L-shaped quartz pipe. An atmosphere of inert gas or a vacuum is sealed inside the quartz pipe.

The ceiling heating lamp 53 radiates heat rays at a peak wavelength of approximately 1.0 microns to 2.0 microns as thermal energy. The ceiling heating lamp 53 is set to heat the wafer 1 by radiation with virtually no heating of the process tube 31.

A cap heating lamp 53A group installed between the boat 30 and the heat-insulating cap 48 is structured to heat the wafer 1 group from below the process tube 31.

As shown in FIG. 3, the heating lamp 52 group, the ceiling heating lamp 53 group, and the cap heating lamp 53A group are connected to a heat lamp driver device 54. A temperature controller 55 controls the heat lamp driver device 54.

A cascade thermocouple 56 is installed vertically in the inner side of the process tube 31. This cascade thermocouple 56 sends measurement results to the temperature controller 55. The temperature controller 55 controls the heat lamp driver device 54 by feedback operation based on the temperature measurement from the cascade thermocouple 56.

In other words, the temperature controller 55 finds the differential between the measurement temperature of the cascade thermocouple 56 and the target temperature of the heat lamp driver device 54. If a differential is present, the temperature controller 55 performs feedback control to cancel out that differential.

The temperature controller 55 is structured to perform zone control of the heating lamp 52 group.

Here, zone control is a method where heating lamps are installed separately in multiple range above and below, and measurement points are arranged for the cascade thermocouples in each zone, and feedback control is performed independently or by correlation based on the cascade thermocouple temperature measurements in each of the zones.

Figure 4:
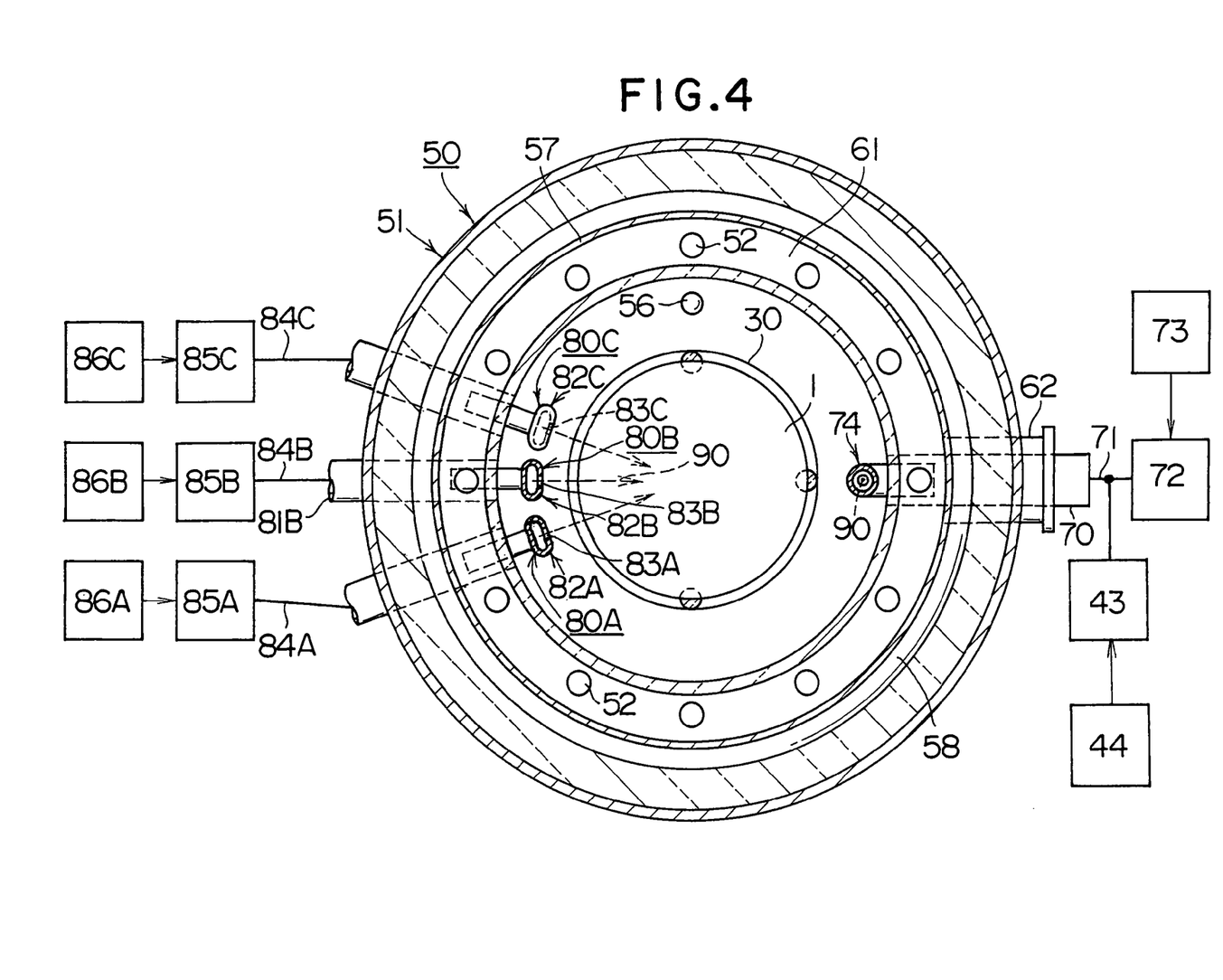
FIG. 4 is a plan cross sectional view of an essential section showing the cooling step.

A tubular shaped reflector (reflector plate) 57 is installed concentrically with the process tube 31 on the outer side of the heating lamp 52 group as shown in FIG. 3 and FIG. 4. The reflector 57 is structured to reflect all the heat rays from the heating lamp 52 group towards the process tube 31. The reflector 57 is formed by coating a stainless plate with a material such as quartz possessing excellent oxidizing resistance, heat resistance and thermal impact resistance.

A cooling water pipe 58 in a corkscrew shape is installed on the outer circumferential surface of the reflector 57 to allow cooling water flow. The cooling water pipe 58 is set to cool the reflector 57 below 300 degrees centigrade which is the heat-resistant temperature of the quartz coating on the surface of the reflector.

Deterioration due to oxidation or other factors tends to occur when the temperature of the reflector 57 exceeds 300 degrees centigrade. However, cooling the reflector 56 below 300 degrees centigrade improves the durability of the reflector 57 and also prevents the particle emissions that occur as the reflector 57 deteriorates. Moreover, cooling the reflector 57 enhances the cooling effect when lowering the temperature inside the heat-insulating tank 51.

The cooling water pipe 58 is structured to control the cooling area that is separated into high-intermediate-low zones on the reflector 57. The zone control of the cooling water pipe 58 allows to cool corresponding to zones on the process tube 31 when lowering the temperature of the process tube 31. For example, increasing the heat capacity just for the wafer group in the zone where the wafers are positioned, makes cooling that zone difficult compared to the zone where there are no wafers. Therefore, the cooling water pipe 58 performs zone control that gives cooling priority to the zone with the wafer group.

Moreover, heater zones can be allocated the same as for cooling water pipe zones. The cooling water pipe zones can be controlled in synchronization with the heater zone control. The control of raising and lowering of temperatures as well as the speed (rate) that the temperatures rise and fall can in this way be improved.

A ceiling reflector 59 formed in a circular plate shape as shown in FIG. 3, is installed concentrically with the process tube 31 on the ceiling surface of the heat-insulating tank 51. The ceiling reflector 59 is structured to completely reflect all heat rays from the ceiling heating lamp 53 group towards the process tube 31. This ceiling reflector 59 is also made from a material possessing superior oxidizing resistance, heat-resistance, and thermal impact resistance.

A zigzag shaped cooling water pipe 60 is installed on the upper side of the ceiling reflector 59. The cooling water pipe 60 is set so as to cool the ceiling reflector 59 below 300 degrees centigrade.

Deterioration due to oxidation or other factors tends to occur when the temperature of the ceiling reflector 59 exceeds 300 degrees centigrade. However, cooling the reflector 59 below 300 degrees centigrade improves the durability of the ceiling reflector 59 and also prevents particle emissions that occur as the ceiling reflector 59 deteriorates. Moreover, cooling the ceiling reflector 59 enhances the cooling effect when lowering the temperature inside the heat-insulating tank 51.

A cooling air passage 61 allowing cooling air to flow as a coolant gas is formed between the heat-insulating tank 51 and the process tube 31 as shown in FIG. 3 and FIG. 4. The cooling air passage 61 is formed to enclose the entire process tube 31. A feed pipe 62 for supplying cooling air to the cooling air passage 61, connects to the lower end of the heat-insulating tank 51. The cooling air supplied to the feed pipe 62 diffuses across the entire circumference of the cooling air passage 61.

An exhaust port 63 for exhausting the cooling air from the cooling air passage 61 is formed in the center section of the ceiling wall of the heat-insulating tank 51. An exhaust duct (not shown in drawing) connecting to the exhaust device connects to the exhaust port 63. A large buffer section 64 connecting to the exhaust port 63 is formed on the lower side of the exhaust port 63 on the ceiling wall of the heat-insulating tank 51. Multiple sub-exhaust ports 65 are formed on the periphery on the bottom surface of the buffer section 64 to connect the buffer section 64 and the cooling air passage 61.

These sub-exhaust ports 65 allow efficiently exhausting the cooling air passage 61. Positioning these sub-exhaust ports 65 in the periphery of the ceiling wall of the heat-insulating tank 51 allows installing the ceiling heating lamps 53 in the center section of the ceiling surface of the heat-insulating tank 51 and removing the ceiling heating lamps 53 from the exhaust passage to prevent chemical reactions and stress due to exhaust flow so that deterioration in the ceiling heating lamp 53 is inhibited.

As shown in FIG. 3, a gas supply pipe 70 as a supply port for supplying gas to the processing chamber 32 is inserted at a position straight upwards above the exhaust port 37 on the manifold 36 along the radius and horizontally. One end of a gas supply line 71 is connected to the outer side of the gas supply pipe 70 and the other end of the gas supply line 71 is connected to a nitrogen gas supply device 72. The nitrogen gas supply device 72 supplies nitrogen gas. A flow rate controller 73 regulates the supplying and the stopping of the nitrogen gas as well as the supply flow rate.

An annealing gas supply device 43 is connected to the gas supply line 71. The annealing gas supply device 43 supplies an annealing gas such as hydrogen gas. A gas flow rate controller 44 regulates the supplying and the stopping of the annealing gas as well as the supply flow rate.

On the inner side of the gas supply pipe 70, one end of an L-shaped nozzle (hereinafter called "gas supply nozzle") 74 made for example from quartz, is inserted onto the gas supply pipe 70 by way of a coupling bent on the lower end. The gas supply nozzle 74 is installed perpendicularly along the inner circumferential surface of the processing chamber 32.

A spray port 74a formed on the top end of the gas supply nozzle 74 is disposed at a position higher than the ceiling plate of the boat 30 at a position higher than the wafer 1 holding area on the boat 30 stored in the processing chamber 32. The spray port 74a is structured to flow gas towards the bottom side of the ceiling wall of the processing chamber 32.

Figure 6:
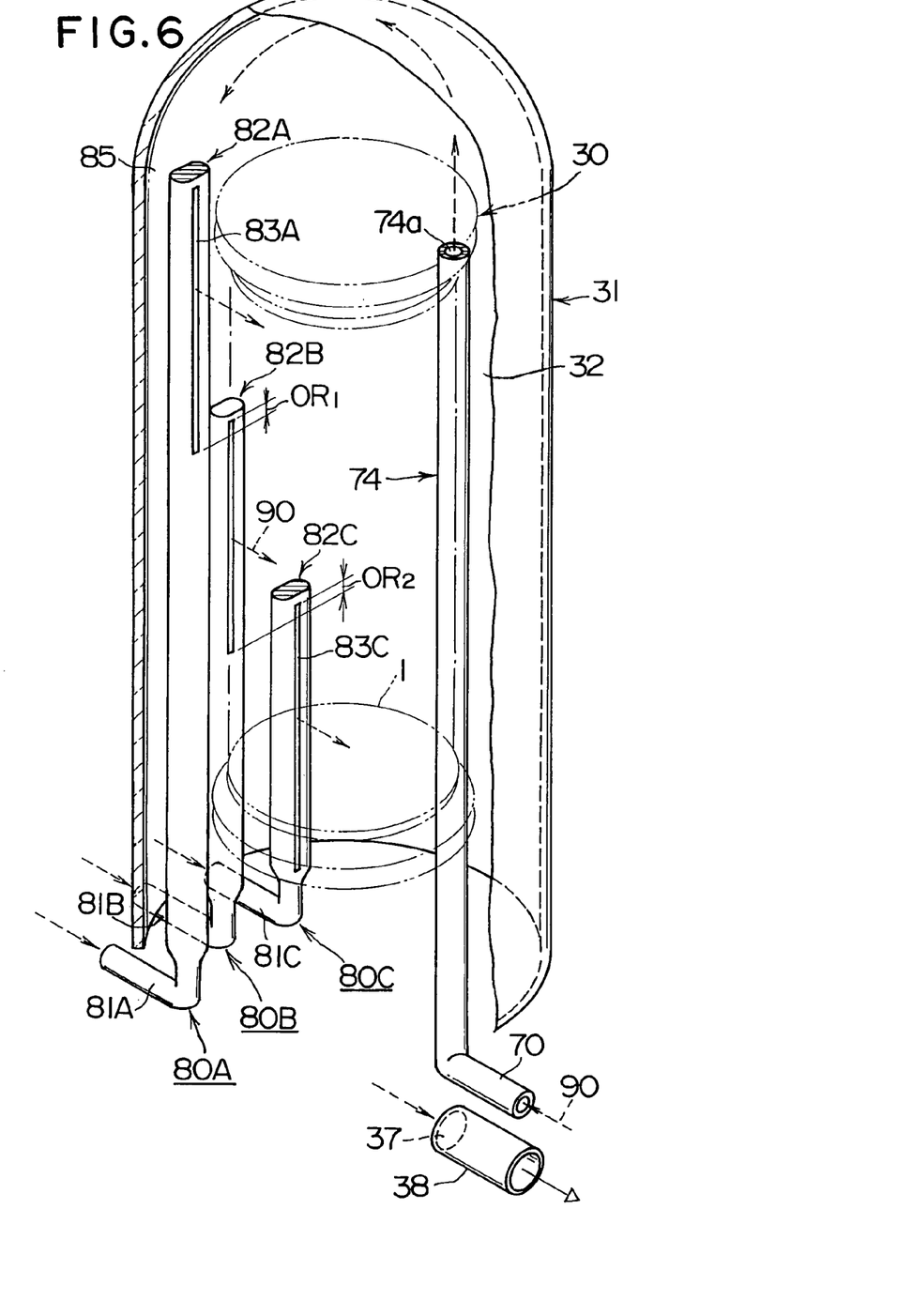
FIG. 6 is a partially abbreviated perspective view of the drawing in FIG. 4.

As shown in FIG. 4 and FIG. 6, three coolant gas supply nozzles (hereinafter sometimes called "side coolant gas supply nozzles") 80A, 80B, 80C for supplying coolant gas to the wafers from the side, are arrayed along the same circular line and installed at an opposite side of the gas supply nozzle 74 on the manifold 36.

These side coolant gas supply nozzles 80A, 80B, 80C are installed to allow replacement from the processing chamber 32 side. These side coolant gas supply nozzles 80A, 80B, 80C are formed for example from quartz.

These side coolant gas supply nozzles 80A, 80B, 80C contain inlet sections 81A, 81B, 81C for feeding coolant gas from below the processing chamber 32, and pipe sections 82A, 82B, 82C extending perpendicularly (right angle) to the main surface of the wafers 1 held in the boat 30 stored inside the processing chamber 32, and spray holes 83A, 83B, 83C formed so as to spray coolant gas towards the wafers 1, 1 adjacent to the pipe sections 82A, 82B, 82C.

The pipe sections 82A, 82B, 82C are installed respectively perpendicularly (vertically) along the inner surface of the processing chamber 32. These pipe sections 82A, 82B, 82C are each formed with an oblong cross section for a large flow path cross sectional area within a limited space between the processing chamber 32 and the boat 30.

As shown in FIG. 4, preferably installing the pipe sections 82A, 82B, 82C with an oblong cross section along an arc of the same radius so as to supply the coolant gas towards the center of the wafers 1 allows utilizing the limited space more effectively, and cooling the wafers with good efficiency.

The lengths of the pipe sections 82A, 82B, 82C differ in large, medium and small sizes. In the present embodiment, the pipe sections 82A, 82B, 82C are installed in the order of large, medium and small.

The spray holes 83A, 83B, 83C are all formed in a long narrow slit shape extending upwards and downwards, and each formed on the upper end of the pipe sections 82A, 82B, 82C of different lengths. The spray holes 83A, 83B, 83C are formed on the main surface of the pipe sections 82A, 82B and 82C which faces the interior of the processing chamber 32 and are disposed on the flat section of the oblong shape.

In order to prevent a pressure differential from occurring across the total length of the spray hole due to the internal pressure in each of the pipe sections 82A, 82B and 82C becoming larger than the pressure of the processing chamber 32 during the supply of coolant gas, the cross sectional area in the area where the spray holes 83A, 83B, 83C are formed on the pipe sections 82A, 82B, 82C is set to be larger than the opening area of the spray holes 83A, 83B, 83C.

Restating this in other words, setting the flow path cross sectional area of the pipe section to be larger than the flow path cross sectional area of the spray hole, serves to make the pipe section flow path resistance smaller than the flow path resistance of the spray hole. Moreover, the internal pressure of the pipe section is set to become larger than the pressure within the processing chamber 32 during the supply of coolant gas.

Further, the cross sectional area of the pipe sections 82A, 82B and 82C in the area where the spray holes 83A, 83B, 83C are formed is set to be larger than the cross sectional area of the inlet sections 81A, 81B, 81C. The cross sectional area can be ensured in this way for the pipe sections without enlarging the manifold 36 upwards or downwards.

For example, enlarging the manifold 36 upwards and downwards reduces the upward and downward size of the process tube 31, so that the number of wafers that can be processed at one time must be reduced.

Conversely, if the upward/downward size of the process tube 31 is left unchanged, then the upward/downward size of the heater unit 50 must also be enlarged, however this can be prevented.

Making the cross section of the pipe sections 82A, 82B and 82C serving as the inlets, into a circular shape makes the gas inlet port which has a circular cross section, easy to connect.

There is, however, a large amount of friction (flow path resistance) at the top end and bottom end of the spray hole causes a drop in flow speed.

As a countermeasure, five millimeter overlap sections $OR_1$, $OR_2$ were provided between the spray hole 83A and spray hole 83B, and between the spray hole 83B and spray hole 83C.

To explain this more specifically in FIG. 6, the lower end of the spray hole 83A is disposed at a position just five millimeters below the upper end of the spray hole 83B to make the overlap section $OR_1$. The lower end of the spray hole 83B is disposed at a position just five millimeters below the upper end of the spray hole 83C to make the overlap section $OR_2$.

As shown in FIG. 4, one ends of three coolant gas supply lines 84A, 84B, 84C are each connected to the inlet sections 81A, 81B, 81C of the three coolant gas supply nozzles 80A, 80B, 80C. The other ends of the three coolant gas supply lines 84A, 84B, 84C respectively connect to three nitrogen gas supply devices 85A, 85B, 85C. Each of these nitrogen gas supply devices 85A, 85B, 85C is structured to supply nitrogen gas as the cooling gas. Flow rate controllers 86A, 86B, 86C regulate the supplying and the stopping of the nitrogen gas as well as the supply flow rate.

The annealing process implemented by the above-mentioned annealing apparatus in the IC manufacturing method is described next.

As shown in FIG. 1 and FIG. 2, the front shutter 13 opens the pod carry-in/out port 12 when the pod 2 is supplied to the pod stage 14. The pod transfer device 18 then carries the pod 2 on the pod stage 14 from the pod carry-in/out port 12 into the interior of the case 11.

The pod transfer device 18 automatically transfers the carried-in pods 2, to the specified rack plate 17 of the rotating pod rack 15, and the pod 2 is stored temporarily on that rack plate 17.

The pod transfer device 18 transfers the stored pod 2 to the one pod opener 21 for placing on the mount stand 22. At this time, the wafer carry-in/out port 20 of the pod opener 21 is closed by the cap fitter/remover 23. Nitrogen gas is filled in the transfer chamber 24. The oxygen content in the transfer chamber 24 for example is set below 20 ppm which is far lower than the oxygen content of the interior (atmospheric air) of the case 11.

The opening end of the pod 2 mounted on the mount stand 22 is pressed against the periphery of the opening of the wafer carry-in/out port 20 on the front of the sub-case 19. The cap fitter/remover 23 removes the cap to open the wafer loading/unloading port.

The wafer transfer device 25 scoops up the multiple wafers 1 stored in the pod 2, carries the wafers from the wafer carry-in/out port 20 to the standby chamber 26 via the transfer chamber 24, and charges them into the boat 30. The wafer transfer device 25 that delivered the wafers 1 to the boat 30, returns to the pod 2, and charges the next wafers 1 into the boat 30.

By subsequently repeating the operation by wafer transfer device 25, all of the wafers 1 of the pod 2 on the mount stand 22 of the one pod opener 21 are sequentially charged into the boat 30.

While the wafer transfer device 25 is charging wafers on the one (upper stage or lower stage) pod opener 21 into the boat 30, the pod transfer device 18 transfers a separate pod 2 from the rotating pod rack 15 to the other (lower stage or upper stage) pod opener 21, and the opening task of the pod 2 by the pod opener 21 simultaneously proceeds.

When the other pod opener 21 simultaneously starts the opening task in this way, the wafer transfer device 25 can start the task of charging the wafers on the pod 2 set on the other pod opener 21 into the boat 30, simultaneous with the end of the charging operation of the wafers 1 on the one pod opener 21 into the boat 3. The wafer transfer device 25 in other words is capable of continuously charging the wafers into the boat 30, without wasting any time in standby when switching the pod 2, so that the annealing apparatus 30 can achieve a high throughput.

When a pre-specified number of wafers 1 are charged into the boat 30 as shown in FIG. 3, the boat 30 holding the wafer 1 group is loaded into the processing chamber 32 of the process tube 31 via the seal cap 29 raised by the boat elevator 27.

Figure 5:
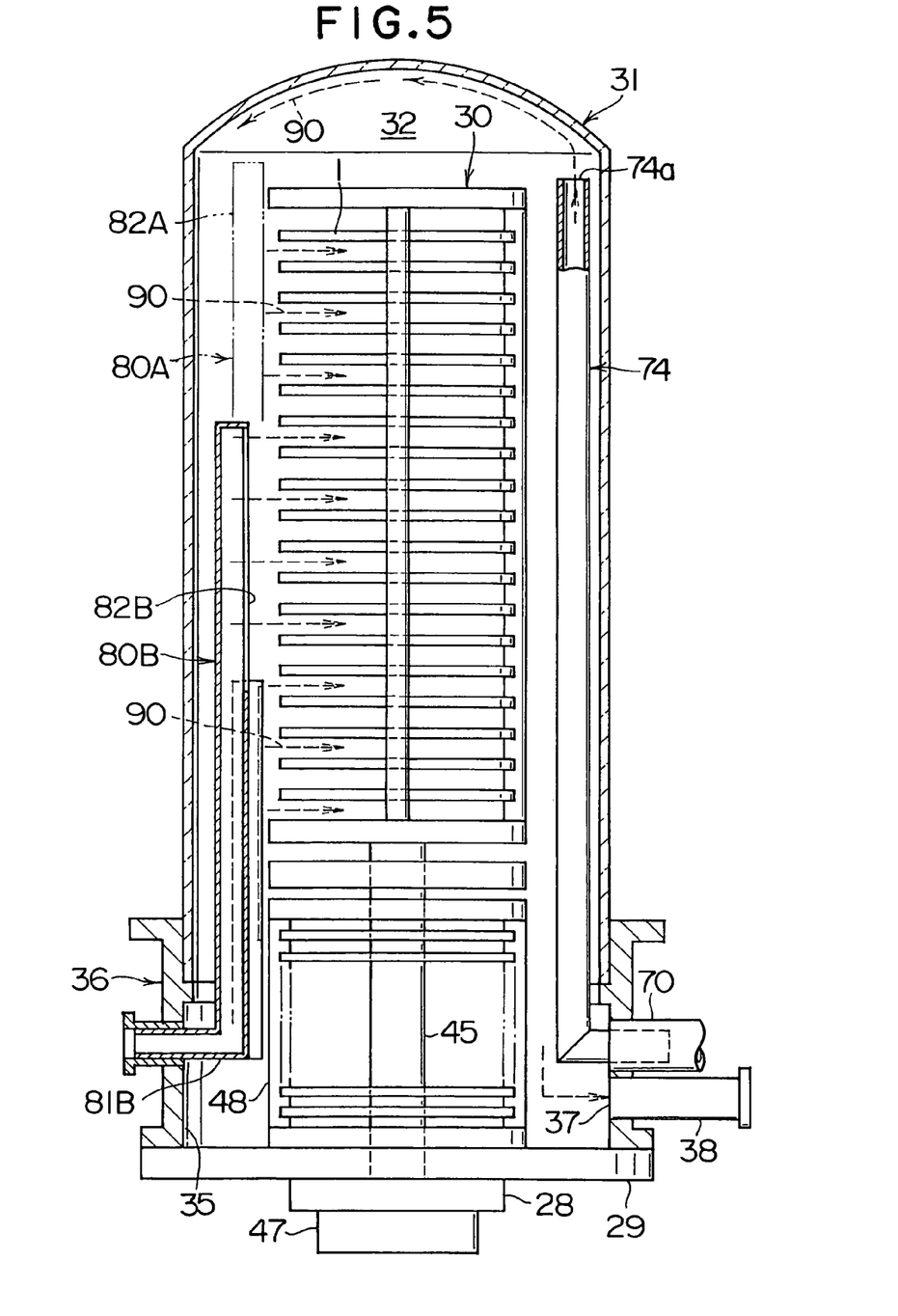
FIG. 5 is a partially abbreviated rear cross sectional view of the drawing in FIG. 4.

As can be seen in FIG. 5, after the boat reaches the top limit, the seal cap 29 presses against the manifold 36 to seal the interior of the process tube 31. The boat 30 is then placed in the processing chamber 32 in a state where still supported by the seal cap 29.

Next, the nitrogen gas supply device 72 supplies inert gas from the gas supply nozzle 74 while the interior of the process tube 31 is exhausted via the exhaust port 37, and the heating lamp 52 group and the ceiling heating lamp 53 group heat the interior of the processing chamber to the target temperature of sequence control by the temperature controller 55.

Feedback control utilizes measurement results from the cascade thermocouple 56 to correct the differential between the sequence control target temperature for the heating lamp 52 group, the ceiling heating lamp 53 group and the cap heating lamp 53A group, and the actual temperature rise inside the process tube 31 due to heating by the heating lamp 52 group, the ceiling heating lamp 53 group and the cap heating lamp 53A group. The motor 47 rotates the boat 30.

The annealing gas supply device 43 supplies annealing gas via the gas supply nozzle 74 into the processing chamber 32 of the process tube 31, when the internal pressure and temperature in the process tube 31 and the rotation of the boat 30 reach an overall fixed, stable state. The annealing gas supplied by the gas supply nozzle 74 flows through the interior of the processing chamber 32 of the process tube 31 and is exhausted from the exhaust port 37.

During flow through the processing chamber 32, the wafers 1 are annealed by the heat reaction that occurs due to the annealing gas contacting the wafers 1 that are heated to a specified temperature.

Typical processing conditions for implementing this heat treatment are described next.

The processing temperature is a specified temperature selected between 100 to 400 degrees centigrade and is maintained for example, at a fixed temperature such as 200 degrees centigrade at least during processing.

One gas selected from among the following gases is utilized during annealing.

(1) Only nitrogen ($N_2$) gas
(2) Gas mixture of nitrogen gas and hydrogen ($H_2$) gas
(3) Only hydrogen gas
(4) Gas mixture of nitrogen gas and deuterium gas
(5) Only deuterium gas
(6) Only argon (Ar) gas The processing pressure is a specified pressure selected between 13 Pa to 101000 Pa, and is maintained for example, at a fixed pressure such as 100000 pa at least during processing.

However, not only is there no need to maintain the process tube 31 and the heater unit 50 temperature at higher than the processing temperature but their temperatures are preferably lowered below the processing temperature so that coolant air is supplied from the feed pipe 62 in the annealing step, and allowed to flow in the cooling air passage 61 by being exhausted from the sub-exhaust port 65, the buffer section 64 and the exhaust port 63.

The heat capacity of the heat-insulating tank 51 is in this case set smaller than that in the usual practice so that cooling can be achieved swiftly.

Forced cooling by making coolant air flow into the coolant air passage 61 in this way allows cooling the process tube 31 and the heater unit 50. During annealing with nitrogen gas for example, this forced cooling allows maintaining the temperature of the processing tube 31 at about 50 degrees centigrade as the temperature inside the processing chamber during loading and unloading.

Coolant air can be utilized as refrigerant gas since the cooling air passage 61 is isolated from the processing chamber 32.

However, an inert gas such as nitrogen gas may also be utilized as the refrigerant gas in order to prevent corrosion at high temperatures due to impurities in the air, or in order to enhance the cooling effect to a higher level.

After the supply of process gas has been stopped when the specified processing time has elapsed, the gas supply nozzle 74 and the side coolant gas supply nozzles 80A, 80B, 80C are respectively supplied with nitrogen gas 90 as the coolant gas as shown in FIG. 4, FIG. 5 and FIG. 6. The flow rate controllers 73, 86A, 86B, 86C each regulate the flow rate of nitrogen gas 90 supplied at this time to an optimal value.

The spray port 74a of the gas supply nozzle 74 and the spray holes 83A, 83B, 83C of the side coolant gas supply nozzles 80A, 80B, 80C each spray the nitrogen gas 90 supplied to the gas supply nozzle 74 and the side coolant gas supply nozzles 80A, 80B, 80C. The nitrogen gas 90 makes uniform contact with the wafer 1 group arranged by the boat 30 in the processing chamber 32, and is suctioned and evacuated from the exhaust port 37 at the bottom end of the processing chamber 32.

As shown in FIG. 5 and FIG. 6, the gas supply nozzle 74 sprays the nitrogen gas 90 supplied from the gas supply pipe 70 from the spray port 74a on the upper end of the gas supply nozzle 74 towards the ceiling surface of the processing chamber 32. The nitrogen gas 90 blown directly on the ceiling surface of the processing chamber 32 is extremely effective in cooling the ceiling wall of the process tube 31.

However, when the spray port 74a of the gas supply nozzle 74 is disposed at a position lower than the upper side end plate of the boat 30, then a flutter phenomenon (Flutter phenomenon is a phenomenon causing a tiny vibration in the wafer 1 on the boat) in which upward gas flow makes the wafer 1 flutter occurs.

The fluttering of the wafer 1 might cause transfer errors of the wafer 1 due to wafer 1 position deviations versus the boat 30 or cause particle emissions and scratches on the backside of the wafer due to friction between the boat 30 and the wafer 1.

However, in the present embodiment, the spray port 74a of the gas supply nozzle 74 is disposed at a position higher than the upper side end plate of the boat 30, and is set to spray the nitrogen gas 90 towards the ceiling surface of the processing chamber 32. Thus, after striking the ceiling surface of the processing chamber 32, the nitrogen gas sprayed from the spray port 74a of the gas supply nozzle 74 flows in layers and diffuses so that the wafers 1 do not flutter.

If the spray speed of the nitrogen gas 90 sprayed from the spray port 74a of the gas supply nozzle 74 is too high, then the flow of the nitrogen gas 90 from the spray port 74a will strike the ceiling surface with great force, and the nitrogen gas 90 flow will be deflected without diffusing. This deflected flow might sometimes flow between the wafers 1, 1 held in the upper section of the boat 30.

This laminar flow of nitrogen gas 90 between the wafers 1, 1 held in the upper section of the boat 30 offers the possibility of rendering a highly efficient cooling effect on the wafer 1 group held in the upper section of the boat 30 which is the most difficult section to cool.

However, if the spray speed of the nitrogen gas 90 sprayed from the spray port 74a of the gas supply nozzle 74 is excessively high, then this may cause flutter in the wafers 1 of the wafer 1 group held in the upper section of the boat 30 so caution is needed.

In this case, the flow rate controller 73 regulates the flow rate of the nitrogen gas 90 to a rate of 100 to 200 liters per minute.

In the present embodiment, the gas supply nozzle 74 is installed at a position facing the side coolant gas supply nozzles 80A, 80B, 80C. The flow speed of the nitrogen gas 90 sprayed from the spray port 74a of the gas supply nozzle 74 and striking the ceiling surface can be suppressed to an appropriate speed. Therefore, the occurrence of flutter caused by a fast nitrogen gas 90 flow speed in the wafers 1 of the wafer 1 group held in the upper section of the boat 30 can be prevented.

Incidentally, the upper end section of the gas supply nozzle 74 can be cut diagonally, in order to set the flow speed and angle of the nitrogen gas 90 striking the ceiling surface of the processing chamber 32 to an optimal value.

However, though the spray of the nitrogen gas 90 from the gas supply nozzle 74 can reduce the temperature deviation among the wafer surfaces, the spray of nitrogen gas 90 from only the gas supply nozzle 74 cools just the peripheral area of the wafers 1 so that the temperature deviation within the wafer surface becomes large.

As a countermeasure, in the present embodiment, the side coolant gas supply nozzles 80A, 80B, 80C are installed to the side of the boat 30 so that the nitrogen gas 90 flows from the side uniformly between the adjacent wafers 1, 1.

In other words, as shown in FIG. 4, FIG. 5 and FIG. 6, the nitrogen gas 90 supplied respectively to the side coolant gas supply nozzles 80A, 80B, 80C is sprayed horizontally into the processing chamber 32 from the spray holes 83A, 83B, 83C, and flows from the side of the wafer 1 uniformly between the adjacent wafers 1, 1.

The side coolant gas supply nozzles 80A, 80B, 80C are installed at a position opposite the gas supply nozzle 74 at this time so that the previously described occurrence of flutter in the wafers 1 of the wafer 1 group held in the upper section of the boat 30 caused by a fast nitrogen gas 90 flow speed is prevented.

On the side coolant gas supply nozzles 80A, 80B, 80C, the cross sectional area of the pipe section in the area of the spray hole formed in a long narrow slit shape extending up and down, is set larger than the opening area of the spray hole. The pressure inside the pipe section of the coolant gas supply nozzle is therefore larger than the pressure inside the processing chamber 32 when the nitrogen gas inside the nozzle is supplied from the inlet section, and a roughly uniform horizontal flow speed from the spray holes 83A, 83B, 83C can be maintained.

The spray holes 83A, 83B, 83C of the side coolant gas supply nozzles 80A, 80B, 80C are formed in long narrow slit shapes extending up and down. The coolant gas sprayed from the respective spray holes 83A, 83B, 83C can therefore simultaneously cool at least two or more wafers under the same conditions. Moreover, the pressure within the processing chamber 32 and the flow rate of the nitrogen gas 90 can cover a wide range.

The nitrogen gas 90 sprayed into the processing chamber 32 respectively from the spray holes 83A, 83B, 83C of the side coolant gas supply nozzles 80A, 80B, 80C can for example be set to slow flow speed so that the nitrogen gas 90 can make contact slowly with the wafer 1 group to efficiently remove heat from the wafer 1 group.

The spray hole 83A of the long length coolant gas supply nozzle 80A is formed with the opening facing the upper section of the wafer holding area of the boat 30 so that the nitrogen gas 90 is sprayed onto the upper section of the wafer holding area of the boat 30.

The spray hole 83B of the medium length coolant gas supply nozzle 80B is formed with the opening facing the center section of the wafer holding area of the boat 30 so that the nitrogen gas 90 is sprayed onto the center section of the wafer holding area of the boat 30.

The spray hole 83C of the short length coolant gas supply nozzle 80C is formed with the opening facing the lower section of the wafer holding area of the boat 30 so that the nitrogen gas 90 is sprayed onto the lower section of the wafer holding area of the boat 30.

By setting a uniform flow speed for the nitrogen gas 90 sprayed from each of the spray holes 83A, 83B, 83C of the side coolant gas supply nozzles 80A, 80B, 80C, the nitrogen gas 90 can cool the wafer 1 group uniformly along the entire length.

At this time, the flow rate controllers 86A, 86B, 86C regulate the flow rate of the nitrogen gas 90 to a rate of 50 to 100 liters per minute.

Preferably the flow rate from the gas supply nozzle 74 is set to 150 liters per minute, and the flow rate from the side coolant gas supply nozzles 80A, 80B, 80C is set to 75 liters per minute.

Also, the ratio of the gas supply nozzle 74 flow rate versus the total sum of the side coolant gas supply nozzle 80A, 80B, 80C flow rates is preferably set as 1 to 1.

The flow speed at the top end and bottom end of the spray holes 83A, 83B, 83C of the side coolant gas supply nozzles 80A, 80B, 80C drops due to friction.

In the present embodiment, however, an overlap section $OR_1$ is provided between the spray hole 83A of the long coolant gas supply nozzle 80A and the spray hole 83B of the medium length coolant gas supply nozzle 80B; and an overlap section $OR_2$ is provided between the spray hole 83B of the medium length coolant gas supply nozzle 80B and the spray hole 83C of the short length coolant gas supply nozzle 80C. These overlap sections $R_1$, $R_2$ compensate for the drop in flow speed. Therefore, a uniform flow speed can be maintained at the boundary between the spray holes 83A and 83B, and the boundary between the spray holes 83B and 83C.

During the spray of the nitrogen gas 90 onto the wafer 1 group, the motor 47 rotates the boat 30 so that the temperature differential within the surface of the wafer 1 can be reduced even further.

In other words, rotating the boat 30 holding the wafers 1 while showering the nitrogen gas 90 on the wafers 1, allows the nitrogen gas 90 to make uniform contact with the wafers 1 across their entire circumference to reduce the temperature differential within the surface of the wafer 1.

As described above, the nitrogen gas 90 makes direct contact with the wafers 1 to remove their heat. Moreover, the nitrogen gas 90 makes uniform contact across the entire length of the wafer 1 group so that not only does the temperature of the wafer 1 group swiftly lowers at a high rate (speed) but the temperature also lowers uniformly within the surface of the wafer 1 and across the entire length of the wafer 1 group.

After the nitrogen gas 90 has forcibly cooled the wafer 1 group, the boat elevator 27 lowers the boat 30 supported by the seal cap 29 so that the boat is unloaded from the processing chamber 32.

The spray holes 83A, 83B, 83C of the side coolant gas supply nozzles 80A, 80B, 80C blow the nitrogen gas 90 onto the wafer 1 group even during this boat unloading so that along with rapidly lowering the temperature of the wafer 1 group at a high rate (speed), the temperature lowers uniformly within the surface of the wafer 1 and across the entire length of the wafer 1 group.

While lowering this boat 30, the spray flow rate of the nitrogen gas 90 from the spray hole 83A of the long coolant gas supply nozzle 80A formed facing the upper part of the wafer holding area on the boat 30, and the spray flow rate of the nitrogen gas 90 from the spray hole 83B of the medium length coolant gas supply nozzle 80B, and the spray flow rate of the nitrogen gas 90 from the spray hole 83C of the short length coolant gas supply nozzle 80C formed facing the lower part of the wafer holding area on the boat 30 are regulated as needed to allow zone regulation of the cooling speed by the nitrogen gas 90 in the upper and lower direction of the boat 30 in order to prevent a temperature differential from occurring above and below the wafer 1 group row being held in the boat 30.

The wafer transfer device 25 discharges the processed wafers 1 on the boat 30 carried out to the standby chamber 26, and inserts the wafers 1 into the opened pod 2 on the pod opener 21 and then stores them.

During the discharging of the processed wafers 1 from the boat 30, the number of wafers 1 batch-processed per boat 30 is several times larger than the number of wafers 1 stored in one empty pod 2, so the pod transfer device 18 repeatedly supplies multiple pods 2 alternately to the upper/lower pod openers 21, 21.

In this case also, conveyance and preparing operation of the empty pod 2 to the one (upper stage or lower stage) pod opener 21 proceeds simultaneously during wafer transfer to the other (upper stage or lower stage) pod opener 21. Therefore, the wafer transfer device 25 can consecutively perform discharging without wasting any time in standby during the task of interchanging the pod 2, so that the throughput of the annealing apparatus 10 is increased.

After the specified number of processed wafers 1 have been stored, the cap is fitted on the pod 2 by the pod opener 21 and the pod 2 is then closed.

Next, the pod transfer device 18 transfers the pod 2 where the processed wafers 1 are stored, from the mounting stand 22 of the pod opener 21 to the specified rack plate 17 of the rotating pod rack 15 and the pod 2 is stored temporarily.

The pod transfer device 18 transfers the pod 2 where the processed wafers 1 are stored, from the rotating pod rack 15 to the pod carry-in/out port 12, and transfers it from the pod carry-in/out port 12 outside the case 11 and places it onto the pod stage 14. The pod 2 transferred onto the pod stage 14 is transferred by an internal process transfer device to the next process.

The task of interchanging old and new pods 2 between the rotating pod rack 15 and the pod stage 14, and the task of carrying them into and out of the pod stage 14 proceeds simultaneously during the annealing process and the task of carrying the boat 30 into and out of the processing chamber 32 so that a delay in the overall task time by the annealing apparatus 10 can be prevented.

The process of annealing the wafers 1 in the annealing apparatus 10 is implemented by repeating the above described operations.

The above embodiment renders the following effects.

1) After the heat treatment, the gas supply nozzle and/or the side coolant gas supply nozzles blow the nitrogen gas serving as the coolant gas onto the wafer group. The wafer group can therefore be cooled directly and also uniformly across the entire length to render the effect that the speed of the temperature drop in the wafer group is increased, and that temperatures between wafers and temperatures within the wafer surface are made more uniform.

2) Preventing a temperature differential from occurring between wafers in the wafer group and a temperature differential from occurring within the wafer surface, renders the effect that adverse effects on the IC characteristics can be avoided. Moreover, a sufficient drop in temperature can be achieved in the wafer group, rendering the effects that natural oxidation occurring due to exposure of the heated wafer to an atmosphere with large amounts of oxygen can be prevented, and also that the film quality is improved.

After annealing the wafer group formed with copper (Cu) wiring patterns in a processing chamber containing hydrogen gas or a state including hydrogen gas, the wafers can be forcibly cooled within the processing chamber so that defects (voids) in the copper crystal are reduced.

3) Lowering the temperature of the wafer group sufficiently after heat treatment and during boat unloading, renders the effect that the standby time for lowering the temperature after boat unloading can be eliminated or reduced so that the annealing apparatus throughput is improved.

Moreover, during boat unloading in a state where there is a large temperature differential inside and outside the processing chamber after heat treatment, the lower wafers in the boat are cooled earlier due to the lower part of the boat being drawn out earlier, and the upper wafers in the boat are drawn out somewhat later compared to the lower wafers so that the differential in the total heat quantity of the upper and lower wafers in the boat occurs. It can be suppressed that this differential in the total heat quantity exerts adverse effects on the IC characteristics.

4) Nitrogen gas from the spray port at the upper end of the gas supply nozzle is sprayed towards the ceiling wall of the processing chamber, causing the nitrogen gas to blow directly onto the ceiling surface of the processing chamber and render the effect that the cooling of the ceiling wall of the process tube is extremely efficient.

5) The spray port of the gas supply nozzle is disposed at a position higher than the upper side end plate of the boat, and set to blow the nitrogen gas towards the ceiling wall of the processing chamber, so that the nitrogen gas sprayed from the spray port of the gas supply nozzle strikes the ceiling wall of the processing chamber and then flows in layers and diffuses to render the effect that the phenomenon where nitrogen gas causes the wafer to flutter is prevented.

6) Installing the side coolant gas supply nozzles at a position opposite the gas supply nozzle suppresses the flow speed of the nitrogen gas sprayed from the spray port of the gas supply nozzle and striking the ceiling wall to an appropriate speed to render the effect that wafer flutter in the wafer group held in the upper section of the boat, caused by a fast nitrogen gas flow speed can be prevented.

7) Installing multiple side coolant gas supply nozzles allows setting multiple nitrogen gas spray areas in the vertical direction, rendering the effect that the wafer group in the processing chamber can be cooled uniformly along the entire length, and that the nitrogen gas cooling speed can be regulated by zone control during boat unloading.

8) Installing the pipe section of the side coolant gas supply nozzle perpendicularly along the inner circumferential surface of the processing chamber, and also forming in an oblong shaped cross section on the pipe section renders the effect that the flow path cross sectional area of the pipe section can be enlarged in the limited space between the boat and the processing chamber.

9) Setting the cross sectional area in the area where the spray hole is formed on the pipe section of the side coolant gas supply nozzle, larger than the opening area of the spray hole makes the pressure inside the pipe section of the coolant gas supply nozzles larger than the pressure inside the processing chamber to render the effect that a pressure differential across the overall length of the spray hole can be prevented so that the coolant gas flow speed becomes uniform across the entire length of the spray hole.

10) Also, setting the cross sectional area in the area where the spray hole is formed on the pipe section of the coolant gas supply nozzle, larger than the cross sectional area of the inlet section, allows making the pressure inside the coolant gas supply nozzle pipe section larger than the pressure inside the processing chamber, and prevents a pressure differential from occurring across the overall length of the spray hole rendering the effect that the coolant gas flow speed becomes uniform across the entire length of the spray hole.

11) Setting an overlap when arranging the spray holes for the adjacent cooling gas supply nozzles to be adjacent up/down to each other allows compensating for the drop in flow speed at the upper and lower ends of the spray holes to render the effect that the wafers positioned at the respective upper and lower ends of adjacent up/down spray holes, are cooled to the same extent as the wafers not positioned at the upper/lower ends of the spray holes.

The present invention is not limited to the above embodiment and a wide range of variations not departing from the scope and spirit of the invention are permitted.

The side coolant gas supply nozzles for example are not limited to three nozzles and one nozzle, or two nozzles or four or more nozzles may be installed.

Also, the spray area of the nitrogen gas utilized as the coolant gas is not limited to the three top, medium and lower areas and may be set as one, or two or four or more areas.

The spray hole on the side coolant gas supply nozzle is not limited to a slit shape of the same width, and may be formed as a slit shape with the different width in the vertical direction, and may be multiple through holes in circular or square shapes.

The slit shape may in particular be formed so that the width increases towards the top of the slit. This shape is desired because even the inside of the side coolant gas supply nozzle, the coolant gas is placed within the heating zone of the heater so that the coolant gas is affected by heat from the heater even inside the side coolant gas supply nozzle and warms up. The time that the coolant gas sprayed from the slit is subjected to effects from heating by the heater becomes longer, the higher the spray position from the slit, and the temperature of the coolant gas sprayed from the spray hole (slit) gradually rises as the gas flows upward. The flow rate of the coolant gas supplied into the processing chamber therefore becomes large as the gas flows upward, and the coolant gas induces a uniform cooling effect on the multiple upward and downward wafers.

The nitrogen gas supply source may be installed jointly between the gas supply nozzle and the side coolant gas supply nozzle.

The heating means is not limited to use of a halogen lamp whose thermal energy is on a peak wavelength of 1.0 micrometers, and may utilize another heating lamp (for example, a carbon lamp) to irradiate a heat ray (infrared rays or far-infrared rays, etc.) of wavelength (such as 0.5 to 3.5 micrometers); and may utilize an inductive heater, or a metallic heat emitting elements such as Fe—Cr—Al alloy or molybdenum silicide.

An annealing apparatus was described in the above embodiment, however, this invention is applicable to general substrate processing apparatus such as oxidation, diffusion apparatus and CVD apparatus, etc.

The substrate for processing is not limited to wafers and may include photo masks and printed wiring boards, liquid crystal panels, compact disks, and magnetic disks, etc.

Typical aspects for resolving the problems of this application are described next.

(1) A substrate processing apparatus comprising:
a processing chamber for storing a boat supporting multiple substrates and for processing the multiple substrates, a heater unit installed around the processing chamber for heating the substrates, and a coolant gas supply nozzle including a pipe section extending perpendicular to a main surface of the substrate supported in the boat stored in the processing chamber, and a spray hole formed on the pipe section for spraying coolant gas to at least two of the multiple substrates, wherein the coolant gas supply nozzle is formed so that the cross sectional area of the pipe section in the area where the spray hole is formed is larger than the total opening area of the spray hole.

(2) A substrate processing apparatus comprising:

a processing chamber for storing a boat supporting multiple substrates and for processing the multiple substrates, a heater unit installed around the processing chamber for heating the substrates, a coolant gas supply nozzle for supplying coolant gas into the processing chamber, wherein the coolant gas supply nozzle contains an inlet section for feeding coolant gas from below the processing chamber, a pipe section extending perpendicularly to a main surface of the substrate supported in the boat stored in the processing chamber, and a spray hole formed on the pipe section to spray coolant gas to at least two of the multiple substrates, and the cross sectional area of the pipe section in the area where the spray hole is formed is larger than the cross sectional area of the inlet section.

In the above aspects (1) and (2), the coolant gas spray from the coolant gas supply nozzle is capable of lowering the temperature of the processed substrates quickly and uniformly.

In the above first aspect (1), the cross sectional area of the pipe section of the coolant gas supply nozzle in the area where the spray hole is formed is larger than the opening area of the spray hole so that a pressure differential in the coolant gas sprayed from the spray hole can be prevented.

In the above second aspect (2), the cross sectional area of the pipe section of the coolant gas supply nozzle in the area where the spray hole is formed is larger than the cross sectional area of the inlet section so that the flow speed of the coolant gas is lowered and a pressure differential in the coolant gas sprayed from the spray hole can be prevented.

The invention claimed is:

1. A substrate processing apparatus comprising:
a processing chamber for storing a boat supporting multiple substrates and for processing the multiple substrates,
a heater unit installed around the processing chamber for heating the substrates, and
a coolant gas supply nozzle including a pipe section extending perpendicular to a main surface of the substrate supported in the boat stored in the processing chamber, and a spray hole formed on the pipe section for spraying coolant gas to at least two of the multiple substrates,
wherein the multiple coolant gas supply nozzles are installed, and the first coolant gas supply nozzle and the second coolant gas supply nozzle installed adjacent to the first coolant gas supply nozzle are respectively formed so that the upper end of the spray hole of the first coolant gas supply nozzle and the lower end of the spray hole of the second coolant gas supply nozzle overlap each other.

2. A substrate processing apparatus according to claim 1, wherein the cross sectional shape of the pipe section of the coolant gas supply nozzle in the area where the spray hole is formed, is an oblong pipe shape.

3. A substrate processing apparatus according to claim 1, wherein the pipe section of the coolant gas supply nozzle is formed extending perpendicularly, and the spray hole is formed as a long narrow, perpendicular slit.

4. A substrate processing apparatus according to claim 2, wherein the spray hole is formed on a main surface which is straight part of an oblong cross sectional shape on the pipe section and faces the interior of the processing chamber.

5. A substrate processing apparatus according to claim 1, wherein the coolant gas supply nozzle is formed so that the cross sectional area of the pipe section in the area where the spray hole is formed is larger than the total opening area of the spray hole.

6. A substrate processing apparatus according to claim 1, wherein the first coolant gas supply nozzle is formed with a shorter vertical length than the second coolant gas supply nozzle, and the upper end of the spray hole of the first coolant gas supply nozzle is formed to overlap the lower end of the spray hole of the second coolant gas supply nozzle.

7. A substrate processing apparatus according to claim 1, wherein one end of a coolant gas supply line is connected to the inlet section of the coolant gas supply nozzle, and the other end of the coolant gas supply line is connected to a nitrogen gas supply device whose coolant gas flow rate is regulated by a flow rate controller, and the flow rate controller regulates the flow rate between 50 and 100 liters per minute.

8. A substrate processing apparatus according to claim 1, further comprising a gas supply nozzle installed perpendicularly along the inner circumferential surface of the processing chamber from the lower end of the processing chamber and having a spray port positioned higher than the ceiling plate of the boat and structured to flow gas towards the lower surface of the ceiling wall of the processing chamber.

9. A substrate processing apparatus according to claim 8, wherein the coolant gas supply nozzle is installed at a position opposite to the gas supply nozzle centered at the boat.

10. A substrate processing apparatus according to claim 8 comprising:
the multiple coolant gas supply nozzles,
a coolant gas supply line connected to the respective inlet sections of the multiple coolant gas supply nozzles,
a first nitrogen gas supply device connected to the coolant gas supply line,
a gas supply line connected to the coupling section of the gas supply nozzle,
a second nitrogen gas supply device connected to the gas supply line, and
a flow rate controller for regulating the coolant gas flow rate of the first nitrogen gas supply device and the coolant gas flow rate of the second nitrogen gas supply device, wherein
the flow rate controller regulates the gas flow so that: total flow rate per unit of time of the coolant gas sprayed from the spray holes of the multiple coolant gas supply nozzles; and the gas flow rate per unit of time sprayed from the spray port of the gas supply nozzle is a ratio of one-to-one.

11. A substrate processing apparatus according to claim 1, further comprising a rotating shaft for rotating the boat, and a motor for driving the rotating shaft.

12. Multiple coolant gas supply nozzles utilized in a substrate processing apparatus including a processing chamber for storing a boat supporting multiple substrates and for processing the multiple substrates, and a heater unit installed around the processing chamber for heating the substrates, wherein the coolant gas supply nozzle has a spray hole for spraying coolant gas to at least two of the multiple substrates, on a pipe section extending perpendicular to a main surface of the substrate supported in the boat stored in the processing chamber, and the first coolant gas supply nozzle and the second coolant gas supply nozzle installed adjacent to the first coolant gas supply nozzle are respectively formed so that the upper end of the spray hole of the first coolant gas supply nozzle and the lower end of the spray hole of the second coolant gas supply nozzle overlap each other.

13. A coolant gas supply nozzle according to claim 12, wherein the cross section of the pipe section in the area where the spray hole is formed, is an oblong pipe shape.

14. A coolant gas supply nozzle according to claim 12, wherein the pipe section is formed extending perpendicularly, and the spray hole is formed as a long narrow, perpendicular slit.

15. A coolant gas supply nozzle according to claim 12, wherein the spray hole is formed on a main surface which is straight part of an oblong cross sectional shape on the pipe section and faces the interior of the processing chamber.

16. A semiconductor device manufacturing method utilizing the substrate processing apparatus according to claim 8 comprising the steps of:

storing the boat supporting the multiple substrates into the processing chamber, heating the multiple substrates with the heater unit and processing the multiple substrates, spraying coolant gas from the gas supply nozzle spray port and the coolant gas supply nozzle spray hole and cooling the multiple substrates, and unloading the boat supporting the multiple substrates from the processing chamber.

17. A semiconductor device manufacturing method according to claim 16, wherein the step of processing the multiple substrates is a step of annealing the substrates.

18. A semiconductor device manufacturing method comprising the steps of:

storing a boat supporting multiple substrates into a processing chamber, heating the multiple substrates with a heater unit installed around the processing chamber and processing the multiple substrates, spraying coolant gas from each spray hole of multiple coolant gas supply nozzles and cooling the multiple substrates, wherein each of the coolant gas supply nozzles has the spray hole for spraying coolant gas to at least two of the multiple substrates, on a pipe section extending perpendicular to a main surface of the substrate supported in the boat stored in the processing chamber, and the first coolant gas supply nozzle and the second coolant gas supply nozzle installed adjacent to the first coolant gas supply nozzle are respectively formed so that the upper end of the spray hole of the first coolant gas supply nozzle and the lower end of the spray hole of the second coolant gas supply nozzle overlap each other, and unloading the boat supporting the multiple substrates from the processing chamber.

19. A semiconductor device manufacturing method according to claim 18, wherein the step of processing the multiple substrates is a step of annealing the substrates.

20. A semiconductor device manufacturing method according to claim 18, wherein when the multiple substrates are cooled, gas is supplied to flow towards the lower surface of the ceiling wall of the processing chamber from a gas supply nozzle installed at a position opposite to the coolant gas supply nozzle centered at the boat and installed perpendicularly along the inner circumferential surface of the processing chamber from the lower end of the processing chamber and provided with a spray port positioned higher than the ceiling plate of the boat.

* * * * *